United States Patent
Baburske (10) Patent No.: US 12,255,251 B2
(45) Date of Patent: Mar. 18, 2025

(54) SEMICONDUCTOR DEVICE INCLUDING FIRST GATE ELECTRODE AND SECOND GATE ELECTRODE

(71) Applicant: Infineon Technologies AG, Neubiberg (DE)

(72) Inventor: Roman Baburske, Otterfing (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 18/212,906

(22) Filed: Jun. 22, 2023

(65) Prior Publication Data

US 2023/0343863 A1 Oct. 26, 2023

Related U.S. Application Data

(63) Continuation of application No. 17/402,516, filed on Aug. 14, 2021, now Pat. No. 11,728,417.

(30) Foreign Application Priority Data

Aug. 19, 2020 (DE) .......................... 102020121771.4

(51) Int. Cl.
- *H01L 29/739* (2006.01)
- *H01L 29/06* (2006.01)
- *H01L 29/10* (2006.01)

(52) U.S. Cl.
CPC ...... *H01L 29/7397* (2013.01); *H01L 29/0696* (2013.01); *H01L 29/1095* (2013.01)

(58) Field of Classification Search
CPC ............. H01L 29/7397; H01L 29/0696; H01L 29/1095

(Continued)

(56) References Cited

U.S. PATENT DOCUMENTS

| 11,728,417 B2* | 8/2023 | Baburske .............. H01L 29/407 257/288 |
| 2009/0289690 A1* | 11/2009 | Hirler .................. H03K 17/567 327/429 |

(Continued)

FOREIGN PATENT DOCUMENTS

| DE | 102014117364 A1 | 5/2015 |
| DE | 112016002344 T5 | 2/2018 |

(Continued)

OTHER PUBLICATIONS

Miyoshi, Tomoyuki, et al., "Dual side-gate HiGT breaking through the limitation of IGBT loss reduction", PCIM Europe 2017, Nuremberg, Germany, May 16-18, 2017, 315-322.

(Continued)

*Primary Examiner* — Igwe U Anya
(74) *Attorney, Agent, or Firm* — Murphy, Bilak & Homiller, PLLC (57) ABSTRACT

A semiconductor device includes: a drift region of a first conductivity type in a semiconductor body having a first main surface; a body region of a second conductivity type between the drift region and the first main surface; and trenches extending into the semiconductor body from the first main surface and patterning the semiconductor body into mesas. The trenches include: a first trench having first and second electrodes that face one another along a lateral direction, and a dielectric arranged between the first and second electrodes; a second trench having first and second electrodes that face one another along a lateral direction, and a dielectric arranged between the first and second electrodes; and a third trench having first and second electrodes that face one another along a lateral direction, and a dielectric arranged between the first and second electrodes. Additional semiconductor device embodiments are described herein.

20 Claims, 9 Drawing Sheets

(58) Field of Classification Search
USPC .......................................................... 257/288
See application file for complete search history.

(56) References Cited

U.S. PATENT DOCUMENTS

| | | | | |
|---|---|---|---|---|
| 2013/0168760 | A1* | 7/2013 | Hsieh | ............... H01L 29/42376 |
| | | | | 438/270 |
| 2015/0144988 | A1* | 5/2015 | Laven | .................. H01L 29/407 |
| | | | | 257/139 |
| 2016/0190123 | A1 | 6/2016 | Laven et al. | |
| 2016/0352326 | A1* | 12/2016 | Laven | ................. H01L 27/0727 |
| 2019/0189772 | A1 | 6/2019 | Leendertz et al. | |
| 2020/0303524 | A1 | 9/2020 | Matsudai et al. | |
| 2021/0320202 | A1* | 10/2021 | Hsieh | .................... H01L 29/407 |
| 2021/0384346 | A1* | 12/2021 | Hsieh | ................. H01L 29/0634 |

FOREIGN PATENT DOCUMENTS

| | | |
|---|---|---|
| DE | 102016117264 A1 | 3/2018 |
| DE | 102017129955 A1 | 6/2019 |
| DE | 102018107568 A1 | 10/2019 |

OTHER PUBLICATIONS

Sumitomo, Masakiyo, et al., "Injection Control Technique for High Speed Switching with a double gate PNM-IGBT", Proceedings of the 25th International Symposium on Power Semiconductor Devices & ICs, May 2013, Kanazawa, Japan, 2013, pp. 33-36.

* cited by examiner

SEMICONDUCTOR DEVICE INCLUDING FIRST GATE ELECTRODE AND SECOND GATE ELECTRODE

TECHNICAL FIELD

The present disclosure is related to semiconductor devices, in particular to semiconductor devices including a first gate electrode and a second gate electrode.

BACKGROUND

In semiconductor diodes and semiconductor switching devices like IGBTs (insulated gate bipolar transistors) mobile charge carriers may flood a semiconductor region and may form a dense charge carrier plasma that yields a low forward resistance of the semiconductor diode or drift region of the IGBT. The charge carrier plasma is removed in a turn-off period when the device turns into blocking mode. The turn-off process contributes to the dynamic switching losses of the semiconductor device. Typically, a desaturation mechanism may attenuate the charge carrier plasma before switching the device in order to reduce the dynamic switching losses. It is desirable to provide semiconductor devices with improved switching characteristics.

SUMMARY

An example of the present disclosure relates to a semiconductor device. The semiconductor device includes a drift region of a first conductivity type in a semiconductor body having a first main surface. The semiconductor device further includes a body region of a second conductivity type between the drift region and the first main surface. The semiconductor device further includes a plurality of trenches extending into in the semiconductor body from the first main surface. The plurality of trenches pattern the semiconductor body into a plurality of mesas comprising a first mesa between a first trench and a second trench, and a second mesa between the second trench and a third trench. The semiconductor device further includes an electrode in the first trench that is one electrode out of an electrode group of a first gate electrode electrically coupled to a first gate driver output, a second gate electrode electrically coupled to a second gate driver output, and a source electrode electrically connected to a first load contact. The semiconductor device further includes an electrode in the second trench that is another electrode out of the electrode group. The semiconductor device further includes an electrode in the third trench that is a remaining electrode out of the electrode group. The semiconductor device further includes a barrier region of the first conductivity type having a higher doping concentration than the drift region and being arranged between the drift region and the body region in each of the first mesa and the second mesa. A first vertical distance from a bottom of the barrier region to the first main surface is greater than 60% of a second vertical distance from a bottom of the second trench to the first main surface.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of semiconductor devices, e.g. vertical power semiconductor devices and together with the description serve to explain principles of the embodiments. Further embodiments are described in the following detailed description and the claims.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes, in addition to a permanent low-resistive connection, that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact is a non-rectifying electrical junction with a linear or almost linear current-voltage characteristic.

Ranges given for physical dimensions include the boundary values. For example, a range for a parameter y from a to b reads as $a \leq y \leq b$. A parameter y with a value of at least c reads as $c \leq y$ and a parameter y with a value of at most d reads as $y \leq d$.

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

An example of a semiconductor device may include a drift region of a first conductivity type in a semiconductor body having a first main surface. The semiconductor device may further include a body region of a second conductivity type between the drift region and the first main surface. The semiconductor device may further include a plurality of trenches extending into in the semiconductor body from the first main surface. The plurality of trenches pattern the semiconductor body into a plurality of mesas comprising a first mesa between a first trench and a second trench, and a second mesa between the second trench and a third trench. The semiconductor device may further include an electrode in the first trench that is one electrode out of an electrode group of a first gate electrode electrically coupled to a first gate driver output, a second gate electrode electrically coupled to a second gate driver output, and a source electrode electrically connected to a first load electrode. The semiconductor device may further include an electrode in the second trench that is another electrode out the electrode group. The semiconductor device may further include an electrode in the third trench that is a remaining electrode out of the electrode group. The semiconductor device may further include a barrier region of the first conductivity type having a higher doping concentration than the drift region and being arranged between the drift region and the body region in each of the first mesa and the second mesa. A first vertical distance from a bottom of the barrier region to the first main surface may greater than 60% of a second vertical distance from a bottom of the second trench to the first main surface. In some examples, the first vertical distance from a bottom of the barrier region to the first main surface may range from 60% to 150% of the second vertical distance, or from 60% to 120%, or from 60% to 90% of the second vertical distance.

The semiconductor device may be a vertical power semiconductor device having a load current flow between a first load terminal or load contact at the first main surface and a second load terminal or load contact at a second main surface opposite to the first main surface. The semiconductor device may be a vertical power semiconductor IGBT (insulated gate bipolar transistor), or a power semiconductor reverse conducting (RC) IGBT or a power semiconductor transistor such as a power semiconductor IGFET (insulated gate field effect transistor, e.g. a metal oxide semiconductor field effect transistor), or a power semiconductor diode. The vertical power semiconductor device may be configured to conduct currents of more than 1 A or more than 10 A or even more than 30 A and may be further configured to block voltages between load terminals, e.g. between emitter and collector of an IGBT, or between drain and source of a MOSFET in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

The first main surface may be a level at an interface between the semiconductor body and a wiring area above the semiconductor body at a first side of the semiconductor body.

For example, each of the electrodes in the first to third trenches may be electrically insulated from a surrounding part of the semiconductor body, e.g. from a body or source region, by a dielectric in the corresponding one of the trenches. The dielectric may include one layer or a combination of layers, e.g. a layer stack of dielectric layers, for example oxide layers such as thermal oxide layers or deposited oxide layers, e.g. undoped silicate glass (USG), phosphosilicate glass (PSG), boron silicate glass (BSG), borophosphosilicate glass (BPSG), nitride layers, high-k dielectric layers or low-k dielectric layers. Each of the electrodes in the first to third trenches may include one electrode material or a combination of electrode materials, for example a doped semiconductor material (e.g. a highly doped semiconductor material) such as doped polycrystalline silicon, metal or metal compounds. Although the electrodes in the first to third trenches may be concurrently formed, the electrodes may differ from one another with respect to an electric connection, for example.

All or some parts of each of plurality of first, second and third trenches may be stripe-shaped, for example.

An impurity concentration in the drift region may gradually or in steps increase or decrease with increasing distance to the first main surface at least in portions of its vertical extension. According to other examples the impurity concentration in the drift region may be approximately uniform. For IGBTs based on silicon, a mean impurity concentration in the drift region may be between $2\times10^{12}$ cm$^{-3}$ and $1\times10^{15}$ cm$^{-3}$, for example in a range from $5\times10^{12}$ cm$^{-3}$ to $1\times10^{14}$ cm−3. In the case of a semiconductor device based on SiC, a mean impurity concentration in the drift region may be between $5\times10^{14}$ cm$^{-3}$ and $1\times10^{17}$ cm$^{-3}$, for example in a range from $1\times10^{15}$ cm$^{-3}$ to $2\times10^{16}$ cm$^{-3}$. A vertical extension of the drift region may depend on voltage blocking requirements, e.g. a specified voltage class, of the vertical power semiconductor device. When operating the vertical power semiconductor device in voltage blocking mode, a space charge region may vertically extend partly or totally through the drift region depending on the blocking voltage applied to the vertical power semiconductor device. When operating the vertical power semiconductor device at or close to the specified maximum blocking voltage, the space charge region may reach or penetrate into a field stop region. The field stop region is configured to prevent the space charge region from further reaching to the cathode or collector at a second main surface of the semiconductor body opposite to the first main surface. In this manner, the drift or base region may be formed using desired low doping levels and with a desired thickness while achieving soft switching for the semiconductor device thus formed. For IGBTs, a carrier injection region, e.g. a p$^+$-doped hole injection region for n-channel IGBTs, may be formed between the field stop region and a second load contact at the second main surface of the semiconductor body, for example.

By electrically connecting one of the electrodes, e.g. the first gate electrode, in the first to third trenches to a first gate driver output and another one of the electrodes, e.g. the second gate electrode, in the first to third trenches to a second gate driver output, a dual gate semiconductor device, e.g. a dual gate IGBT, can be provided. The dual gate semiconductor device may allow for switching the device between a conduction optimized state and a switching optimized state. In the conduction optimized state, a voltage applied to the second gate electrode, e.g. VG2, is above a certain threshold voltage. In the switching optimized state, the voltage applied to the second gate electrode, e.g. VG2, is below the certain threshold voltage Vth. Below the threshold voltage a hole inversion channel, i.e. p-channel, may be formed in n-type drift region devices in the mesa below the body region that adjoins to a sidewall of the trench including the second gate electrode. This channel may provide a low-ohmic path for the holes to leave the semiconductor body towards the emitter (source), i.e. the first load contact, and consequently reduces carrier confinement. Switching between VG2 with high carrier confinement, e.g. +15V, and VG2<threshold voltage Vth, e.g. VG2=−8V, or VG2=−10V, or VG2=−15V takes place shortly before the turn-off of the device, e.g. in a so-called desaturation phase.

By electrically connecting another one of the electrodes, the source electrode, to the first load electrode, in case of n-type drift region devices, a distance between the n-channel (carrying the load current) and the p-channel (for desaturation purposes) may be increased, thereby reducing a mutual interference between the n-channel and the p-channel in the desaturation phase. This may allow for improving the desaturation behavior as well as the stability of desaturation.

The barrier region may, e.g. for n-type drift region IGBTs, allow for decreasing a conductivity of the hole path during the desaturation phase and keep the hole current flow restricted next to the trench including the second gate electrode, i.e. away from the trench including the first gate electrode. This may as well allow for improving the desaturation behavior as well as the stability of desaturation.

In some examples, the electrode in the first trench may be the source electrode. The electrode in the second trench may be the first gate electrode, and the electrode in the third trench may be the second gate electrode. For example, only the first mesa out of the first mesa and the second mesa may include a source region adjoining to the second trench. For example, in the first mesa, a source region may adjoin to the second trench. For n-type drift region devices, the first gate electrode may be configured to control an electron channel at an interface between the first mesa and the second trench. Likewise, the second gate electrode may be configured to control a hole channel at an interface between the second mesa and the third trench. This may allow for separating the n-type, i.e. electron channel and the p-type, i.e. hole channel in the desaturation phase by the second trench, and consequently, may allow for reducing a mutual interference between the n-channel and the p-channel in the desaturation phase.

In some examples, the body region in the first mesa and the body region in the second mesa are electrically separated. For example, the body region in the first mesa may be electrically connected to the first load contact, e.g. source (emitter) contact, and the body region in the second mesa may be electrically floating. For example, a contact, e.g. contact plug on the second mesa may be omitted or may be electrically floating.

In some examples, the electrode in the first trench may be the first gate electrode, the electrode in the second trench may be the source electrode, and the electrode in the third trench may be the second gate electrode. For n-type drift region devices, the first gate electrode may be configured to control an electron channel at an interface between the first mesa and the first trench. Likewise, the second gate electrode may be configured to control a hole channel at an interface between the second mesa and the third trench. This may allow for separating the n-type, i.e. electron channel and the p-type, i.e. hole channel in the desaturation phase by the second trench, and consequently, and may allow for reducing a mutual interference between the n-channel and the p-channel in the desaturation phase.

In some examples, any source region in the first mesa adjoins to only the first trench out of the first and second trenches. Thereby, no source region may adjoin to the third trench including the second gate electrode. This may allow for adjusting a saturation current independent of a voltage of the second gate electrode in the third trench, for example.

In some examples, a source region in the second mesa may adjoin to the third trench. This may allow for modulating a saturation current depending on a voltage of the second gate electrode in the third trench, for example.

In some examples, any source region is absent in a part of the second mesa adjoining to the third trench. This may allow for adjusting a saturation current independent of a voltage of the second gate electrode in the third trench, for example, and may further allow for avoiding a combination of the p-channel between the second mesa and the third trench and an n-channel between the second mesa and the second trench, e.g. by omitting the n-channel in the second mesa due to the missing source region.

In some examples, a width of the first mesa at a vertical level corresponding to half of a vertical extension of the first mesa may be smaller than 1.2 µm. The width of the first mesa may even be smaller than 0.8 µm, or smaller than 0.4 µm.

In some examples, a ratio between i) a width of the first mesa at a vertical level corresponding to half of a vertical extension of the first mesa and ii) the vertical extension of the first mesa may be larger than 4. The ratio between a width of the first mesa and a vertical extension of the first mesa may even be larger than 6, or larger than 10, or larger than 14.

In some examples, a maximum doping concentration in the barrier region may be at least a factor of 100 higher than a maximum doping concentration in a part of the drift region adjoining to the barrier region. A vertical extension of the part of the drift region may be equal to a vertical extension of the barrier region. For example, the vertical extension of the barrier region may be equal to a vertical distance between the body region and the drift region, for example. In some other examples, a vertical extension of the part of the drift region may be equal to half of a vertical distance between the barrier region and the second main surface.

In some examples, a dose of first conductivity type dopants of the barrier region may be larger than $2\times10^{13}$ $cm^{-2}$. The dose of first conductivity type dopants of the barrier region may even be larger than $4\times10^{13}$ $cm^{-2}$, or larger than $8\times10^{13}$ $cm^{-2}$. The dose of first conductivity type dopants may correspond to a number of implanted first conductivity type dopant ions per unit area (atoms/$cm^2$). The dose may be determined by integrating a profile of the implanted first conductivity type dopant concentration along the vertical extension of the barrier region. The profile of first conductivity type dopants of the barrier region may be determined by one or more of depth profiling of dopants and contaminants using secondary ion mass spectrometry (classic dynamic SIMS and TOF (time of flight)-SIMS), spreading resistance profiling (SRP), or scanning probe techniques for 2D-profiling, for example.

In some examples, a vertical distance between a maximum doping concentration peak in the barrier region and the first main surface may range from 30% to 70% of the second vertical distance. A vertical distance between a maximum doping concentration peak in the barrier region and the first main surface may also range from 40% to 60% of the second vertical distance.

In some examples, the semiconductor device may further include a second electrode in the first trench, a second electrode in the second trench, and a second electrode in the third trench. In each of the first to third trenches, the electrode and the second electrode may face one another along a lateral direction and a dielectric may be arranged between the electrode and the second electrode. For example, the electrode and the second electrode in each of the first to third trenches may have a same or similar vertical extension and position. By arranging the dielectric between the electrode and the second electrode in the trenches, a lower feedback capacitance may be achieved. This may allow for lower turn-off switching losses Eoff, for example.

In some examples, the semiconductor device may include a transistor cell area and an edge termination area at least partly surrounding the transistor cell area at the first main surface. A percentage of trenches including the second gate electrode may be smaller in a first part of the transistor cell area than in a second part of the transistor cell area. The second part may be arranged between the first part and the edge termination area. The second part may also be arranged between the first part and a gate pad, or between the first part and a gate interconnection line, for example.

In some examples, the width of a channel configured to be controlled by the first gate electrode in one of the plurality of trenches differs from a width of a channel configured to be controlled by the second gate electrode in another one of the plurality of trenches. The width of a channel may correspond to a sum of lateral extensions of all source regions disposed along a longitudinal direction of the corresponding trench where the channel is formed, for example.

The examples and features described above and below may be combined.

Functional and structural details described with respect to the examples above shall likewise apply to the exemplary examples illustrated in the figures and described further below.

In the following, further examples of semiconductor devices are explained in connection with the accompanying drawings. Functional and structural details described with respect to the examples above shall likewise apply to the exemplary embodiments illustrated in the figures and described further below.

Figure 1A:
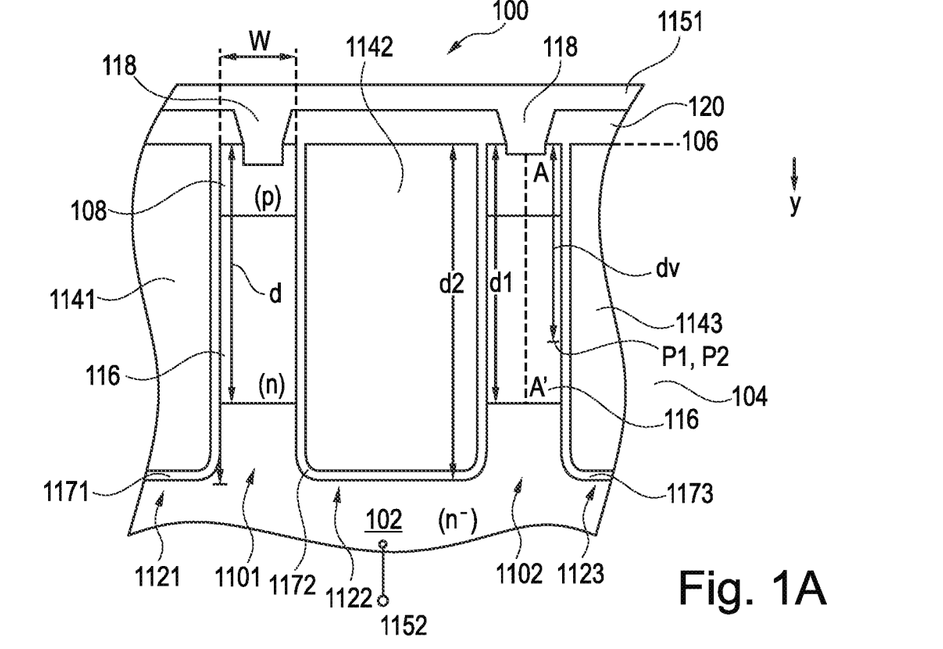
FIG. 1A is a schematic cross-sectional view for illustrating an example of a semiconductor device including a barrier region and first and second gate electrodes.
Figure 1B:
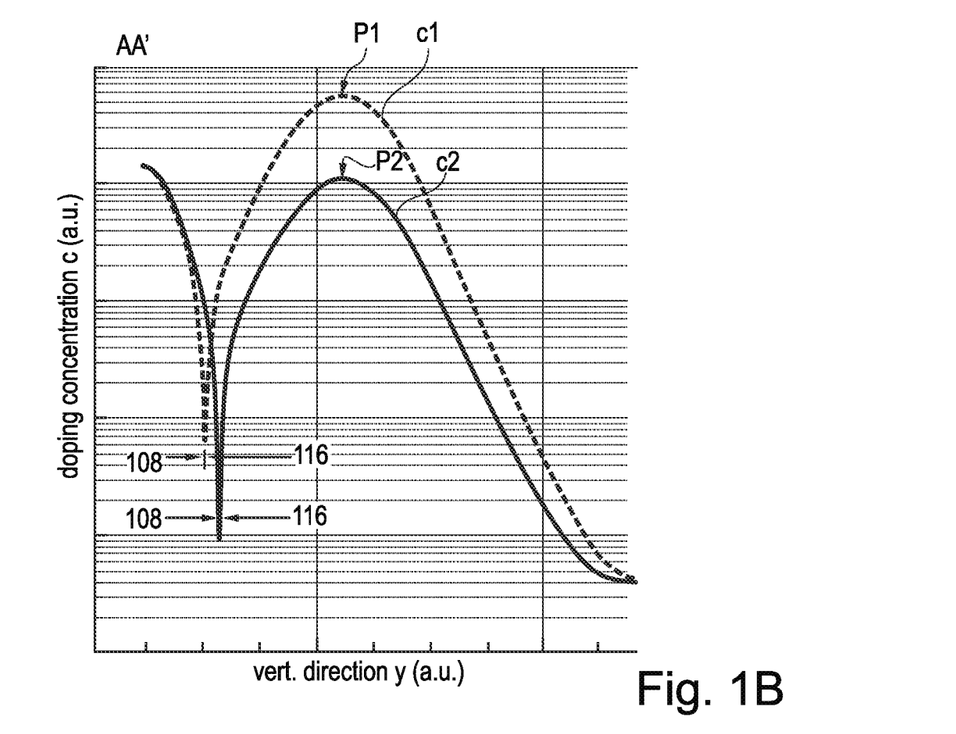
FIG. 1B is a graph illustrating profiles of doping concentration of the barrier region along line AA' of FIG. 1A.

FIG. 1A schematically and exemplarily shows a section of a cross-sectional view of a semiconductor device 100, and FIG. 1B is a schematic graph for illustrating exemplary doping concentration profiles along line AA of FIG. 1A.

The semiconductor device 100 includes an n-doped drift region 102 in a semiconductor body 104 having a first main surface 106. A p-doped body region 108 is arranged between the drift region 102 and the first main surface 106.

A plurality of trenches extends into in the semiconductor body 104 from the first main surface 106. The plurality of trenches pattern the semiconductor body 104 into a plurality of mesas including a first mesa 1101 between a first trench 1121 and a second trench 1122, and a second mesa 1102 between the second trench 1122 and a third trench 1123. The trenches can have straight roughly sidewalls, tilted sidewalls or can be bulge shaped with a higher lateral width at the bottom part compared to the top part of more than 15%, or more than 30%, or even more than 50%.

An electrode in the first trench 1141 is one electrode out of an electrode group of a first gate electrode electrically coupled to a first gate driver output (not illustrated in FIG. 1A), a second gate electrode electrically coupled to a second gate driver output (not illustrated in FIG. 1A), and a source electrode electrically connected to a first load contact 1151. An electrode in the second trench 1142 is another electrode out the electrode group, and an electrode in the third trench 1143 is a remaining electrode out of the electrode group. The electrodes in the electrode group may be assigned to the first, second and third trenches according to various combinations or permutations. Depending on the specific combination, source region(s) may be arranged in the first and/or second mesa 1101, 1102 (not illustrated in FIG. 1A). Dielectrics 1171, 1172, 1173 in the first to third trenches 1121, 1122, 1123 electrically insulate the electrode in the first to third trenches 1141, 1142, 1143 from a surrounding part of the semiconductor body 104.

An n-doped barrier region 116 having a higher doping concentration than the drift region 102 is arranged between the drift region 102 and the body region 108 in each of the first mesa 1101 and the second mesa 1102. A first vertical distance d1 from a bottom of the barrier region 116 to the first main surface 106 is greater than 60% of a second vertical distance d2 from a bottom of the second trench 1122 to the first main surface 106.

The semiconductor device 100 may be a vertical power semiconductor device. In a vertical semiconductor device, a load current may flow along a vertical direction y between a first load contact 1151 at the first surface 106 and a second load contact 1152 at a second surface opposite to the first surface 106, for example. The first load contact 1151 may be an emitter (source) terminal of an IGBT or reverse conducting (RC) IGBT, for example. In case of IGBTs, an n-doped field stop region may be arranged between the drift region 102 and the second load contact 1152, and a $p^+$-doped collector region or hole injection region may be arranged between the field stop region and the second load contact 1152 and may further be electrically connected to the second load contact 1152.

The first load contact 1151 may include or consist of a conductive material or a combination of conductive materials, for example a doped semiconductor material (e.g., a degenerate doped semiconductor material) such as doped polycrystalline silicon, metal or metal compound, for example. The first load contact 1151 may also include a combination of these materials, e.g. a liner or adhesion material and an electrode material. Exemplary contact materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd), for example. The first load contact 1151 may constitute or be part of a wiring area formed over the semiconductor body 104. The wiring area may include one, two, three or even more wiring levels that may include patterned or non-patterned metal layers and interlayer dielectrics arranged between the patterned or non-patterned metal layers. Vias may electrically interconnect the different wiring levels, for example. A groove contact 118 electrically connects the semiconductor body 104, e.g. the body region 108, and the first load contact 1151. As an alternative or in addition to a groove contact, a planar contact may be formed (not illustrated). An interlayer dielectric 120 is arranged between the first load contact 1151 and the first main surface 106. Details for the first load contact 1152 likewise apply to the second load contact 1152.

A ratio between a width w of the first mesa 1101 (or second mesa 1102) at the first main surface 106 and a vertical extension d of the first mesa 1101 is larger than 4. For example, the width of the first mesa 1101 at the first main surface 106 may be smaller than 1.2 µm.

Exemplary profiles of doping concentrations c1, c2 are illustrated in the schematic graph of FIG. 1B that is taken along the vertical direction y of line AA' of FIG. 1A. The profiles of doping concentrations c1, c2 extend across the body region 108 and the barrier region 116. A vertical distance dv between a maximum doping concentration peak P1, P2 in the barrier region 116 and the first main surface 106 ranges from 30% to 70% of the second vertical distance d2.

A dose of n-type dopants of the barrier region 116 may be determined by integrating the concentrations c1, c2 along the vertical extension of the barrier region 116, for example. For example, the dose may be larger than $2 \times 10^{13}$ cm$^{-2}$.

Figure 2:
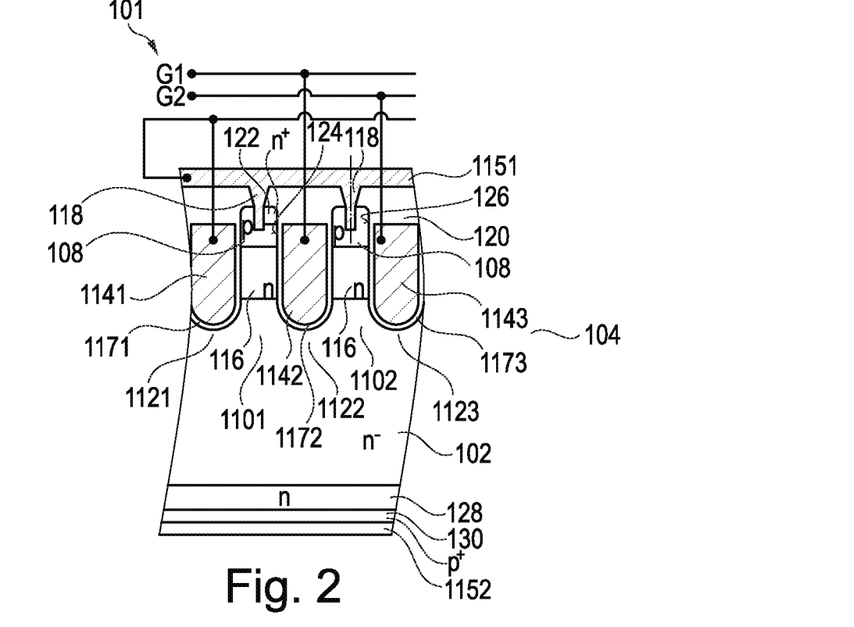
FIGS. 2 to 11 are schematic cross-sectional views for illustrating exemplary designs of IGBTs including a barrier region and first and second gate electrodes.

Referring to the exemplary IGBT 101 in the schematic cross-sectional view of FIG. 2, the electrode in the first trench 1141 is a source electrode electrically coupled to the first load contact 1151. The electrode in the second trench 1142 is a first gate electrode electrically coupled to a first gate driver output G1. The electrode in the third trench 1143 is a second gate electrode electrically coupled to a second gate driver output G2. The first mesa 1101 includes a source region 122 adjoining to the second trench 1122. The electrode in the second trench 1142 is configured to control an electron channel at an interface 124 between the body region 108 in the first mesa 1101 and the second trench 1122. Likewise, the electrode in the third trench 1143 may be configured to control a hole channel at an interface 126 between the second mesa 1102 and the third trench 1123. This may allow for separating the n-type, i.e. electron channel and the p-type, i.e. hole channel in the desaturation phase by the second trench 1142, thereby allowing for reducing a mutual interference between the n-channel and the p-channel in the desaturation phase.

The IGBT 101 further includes an n-doped field stop region 128 between the drift region 102 and the second load contact 1152, and further includes a p-doped collector region or hole injection region 130 between the field stop region 128 and the second load contact 1152.

Figure 3:
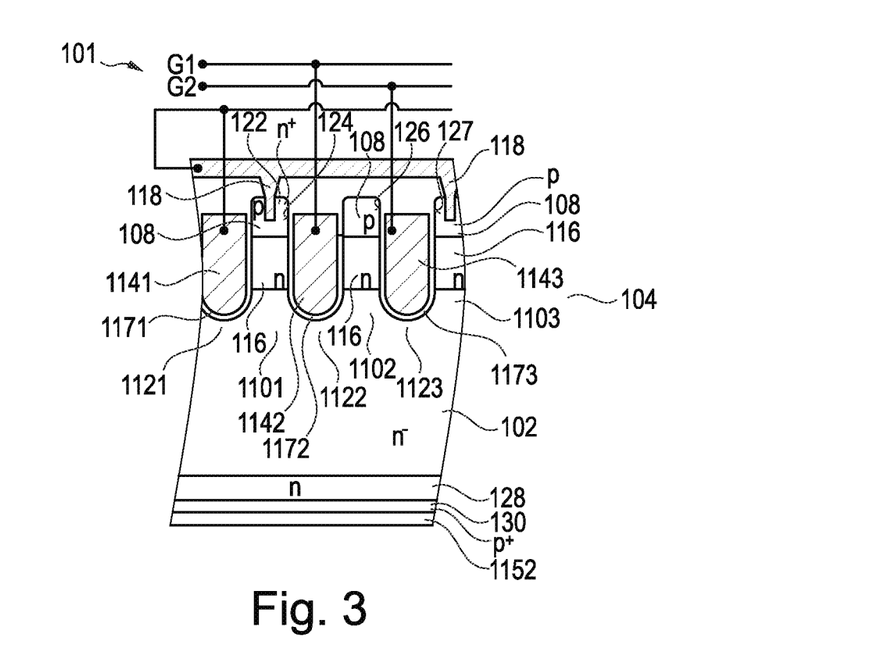

The exemplary IGBT 101 in the schematic cross-sectional view of FIG. 3 is similar to the IGBT 101 in FIG. 2 except that the body region 108 in the second mesa 1102 is electrically separated from the body region 108 in the first mesa 1101. The body region 108 in the second mesa 1102 is electrically floating by omitting an electric contact between the first load contact 1151 and the body region 108. A p-channel for supporting the desaturation phase can be controlled by the electrode in the third trench 1123 at an interface 127 between the body region 108 in a third mesa 1103 and the third trench 1123.

Figure 4A:
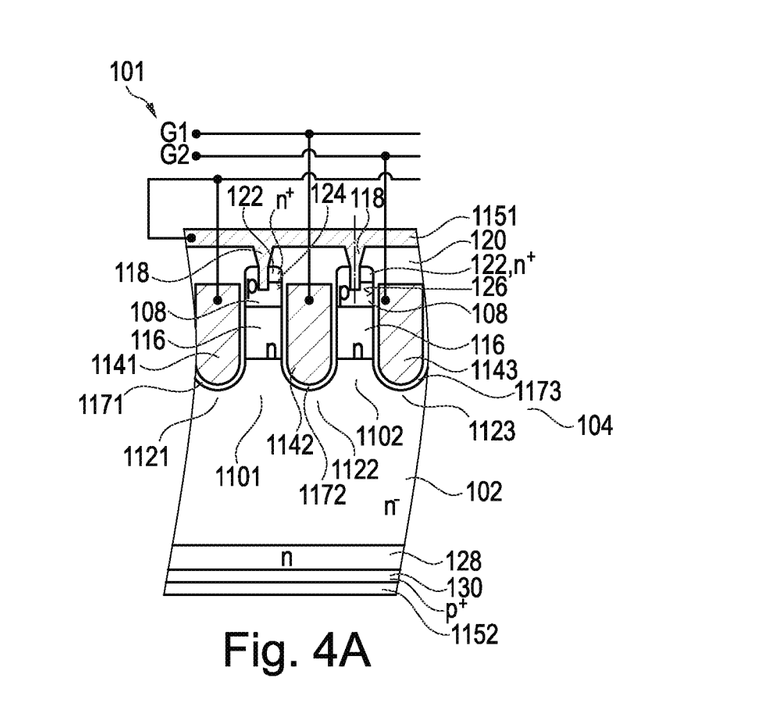
Figure 4B:
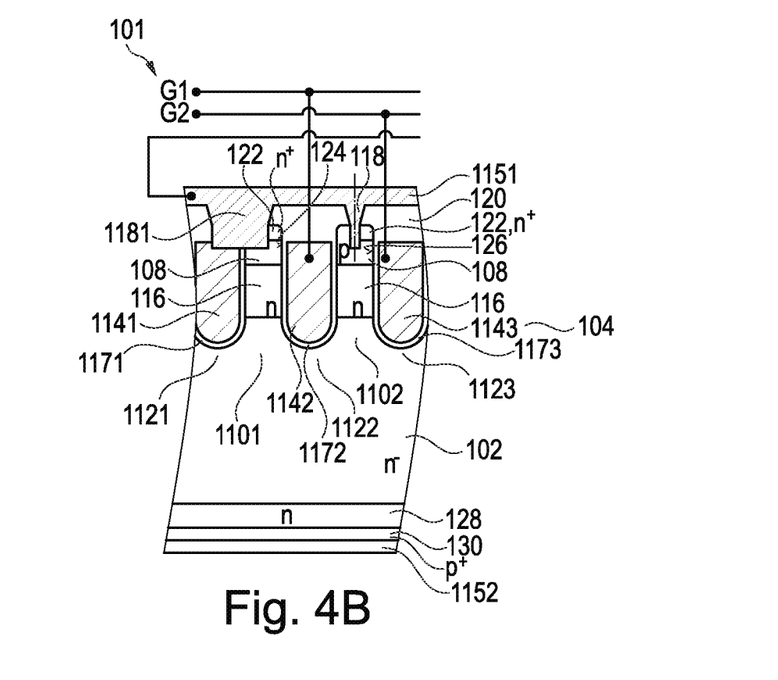
Figure 4C:
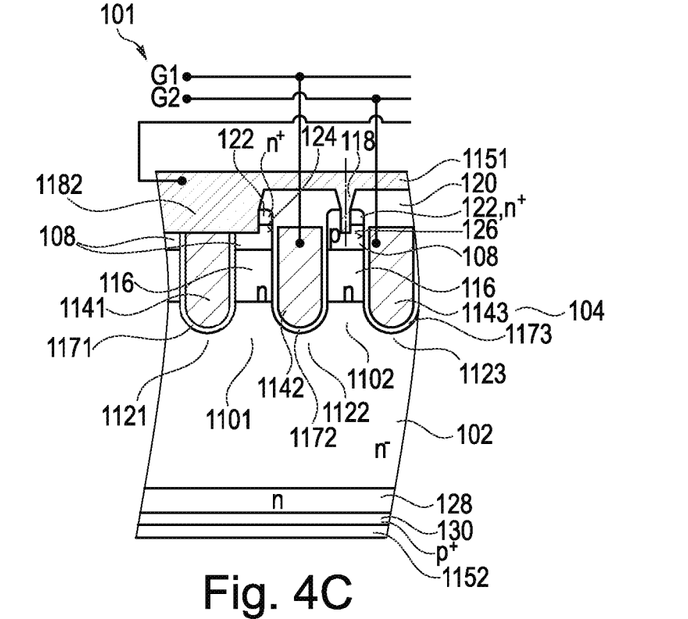

The exemplary IGBT 101 in the schematic cross-sectional view of FIG. 4A is similar to the IGBT 101 in FIG. 2 except that a further source region 122 is arranged in the second mesa 1102 that adjoins to the third trench 1123 but not to the second trench 1122. Alternatively to several groove contacts contacting the mesa and the electrode in the trench separately (mentioned above), a shared groove contact 1181 may connect a mesa and the electrode in a trench adjoining the mesa (see FIG. 4B). A shared groove contact 1182 may also connect mesas and the electrode in a trench between the mesas (see FIG. 4C).

Figure 5:
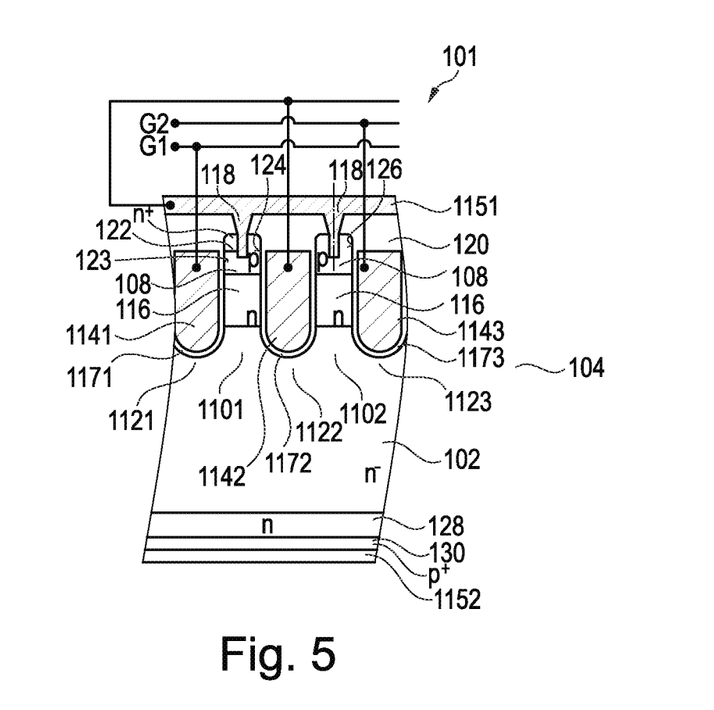

Another exemplary IGBT 101 is illustrated in the schematic cross-sectional view of FIG. 5. The electrode in the first trench 1141 is a first gate electrode electrically coupled to a first gate driver output G1. The electrode in the second trench 1142 is a source electrode electrically coupled to the first load contact 1151. The electrode in the third trench 1143 is a second gate electrode electrically coupled to a second gate driver output G2. The first mesa 1101 includes a source region 122 adjoining to the first trench 1121. The electrode in the first trench 1141 is configured to control an electron channel at an interface 123 between the body region 108 in the first mesa 1101 and the first trench 1121. Likewise, the electrode in the third trench 1143 may be configured to control a hole channel at an interface 126 between the second mesa 1102 and the third trench 1123. This may allow for separating the n-type, i.e. electron channel and the p-type, i.e. hole channel in the desaturation phase by the second trench 1142, thereby allowing for reducing a mutual interference between the n-channel and the p-channel in the desaturation phase.

Figure 6:
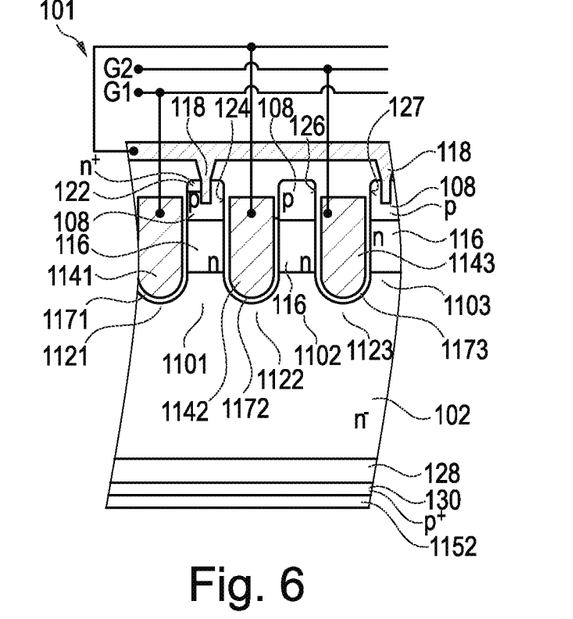

The exemplary IGBT 101 in the schematic cross-sectional view of FIG. 6 is similar to the IGBT 101 in FIG. 5 except that the body region 108 in the second mesa 1102 is electrically separated from the body region 108 in the first mesa 1101. The body region 108 in the second mesa 1102 is electrically floating by omitting an electric contact between the first load contact 1151 and the body region 108. A p-channel at an interface 127 between the body region 108 in a third mesa 1103 and the third trench 1123 can be controlled by the electrode in the third trench 1123 for supporting the desaturation phase.

Figure 7:
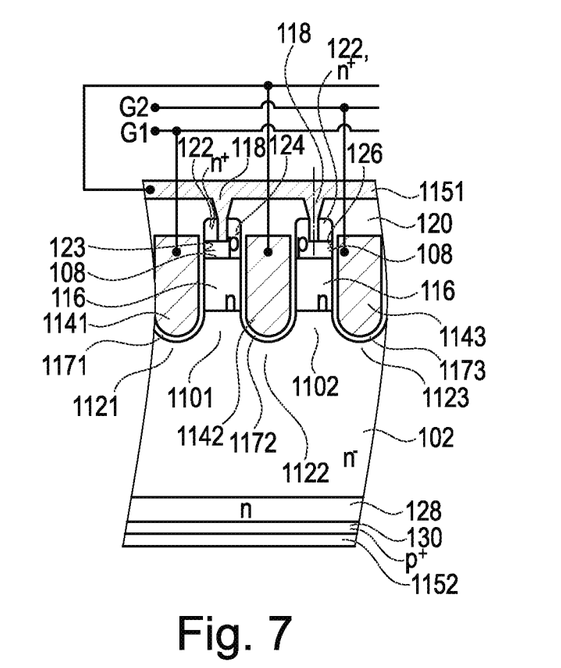

The exemplary IGBT 101 in the schematic cross-sectional view of FIG. 7 is similar to the IGBT 101 in FIG. 5 except that a further source region 122 is arranged in the second mesa 1102 that adjoins to the third trench 1123.

Figure 8:
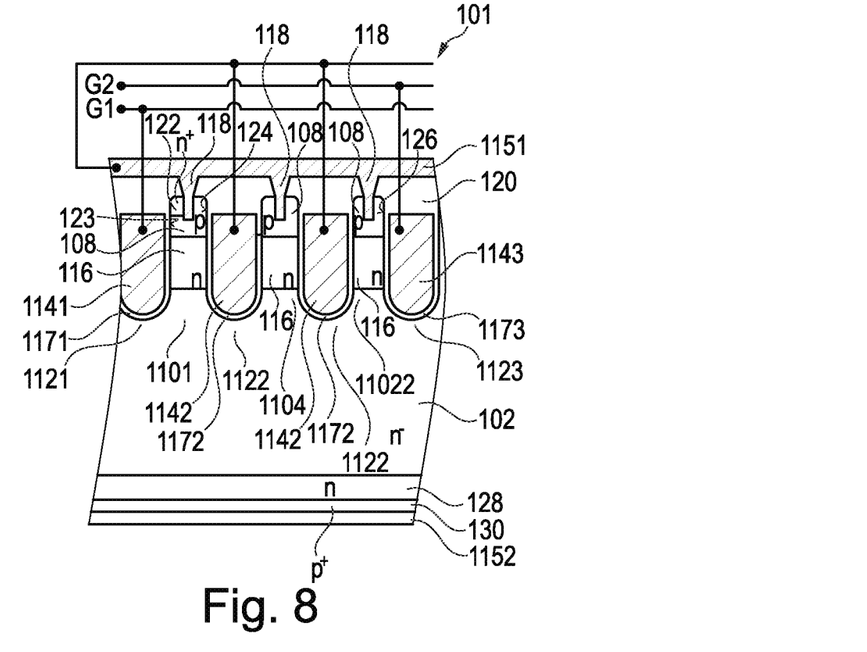
Figure 9:
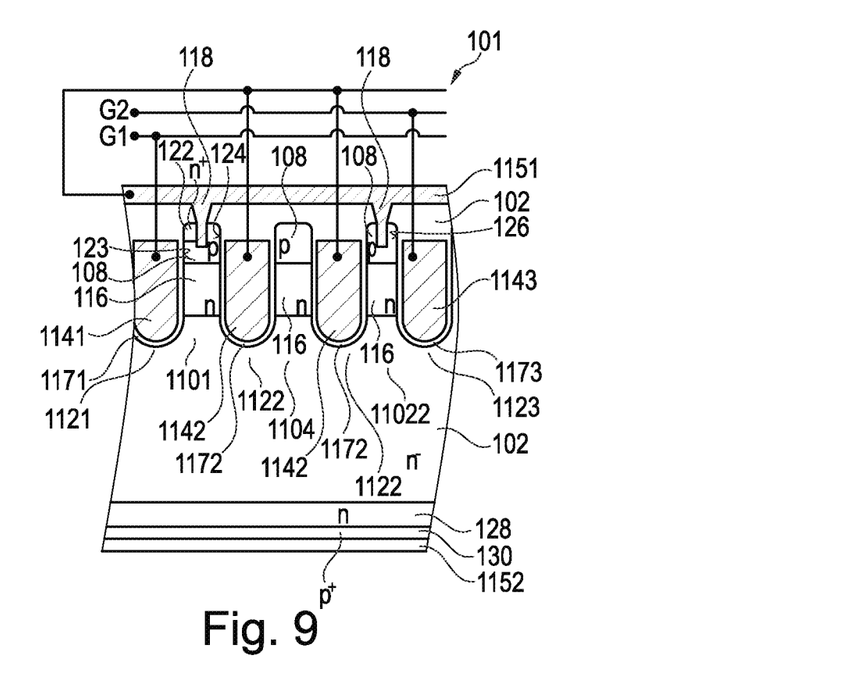

The IGBT designs illustrated in FIGS. 5 to 7 may be modified by arranging more than one second trench 1122 including the source electrode between the first and third trenches 1121, 1123. The exemplary IGBT 101 in the schematic cross-sectional view of FIG. 8 illustrates two second trenches 1122 between the first and third trenches 1121, 1123. In FIG. 8, a fourth mesa region 1104 between the second trenches 1122 is electrically connected to the first load electrode 1151. The exemplary IGBT 101 illustrated in FIG. 9 is similar to the IGBT 101 in FIG. 8 except that the body region 108 in the first mesa 1101 is electrically separated from the body region 108 in the fourth mesa 1104.

Figure 10:
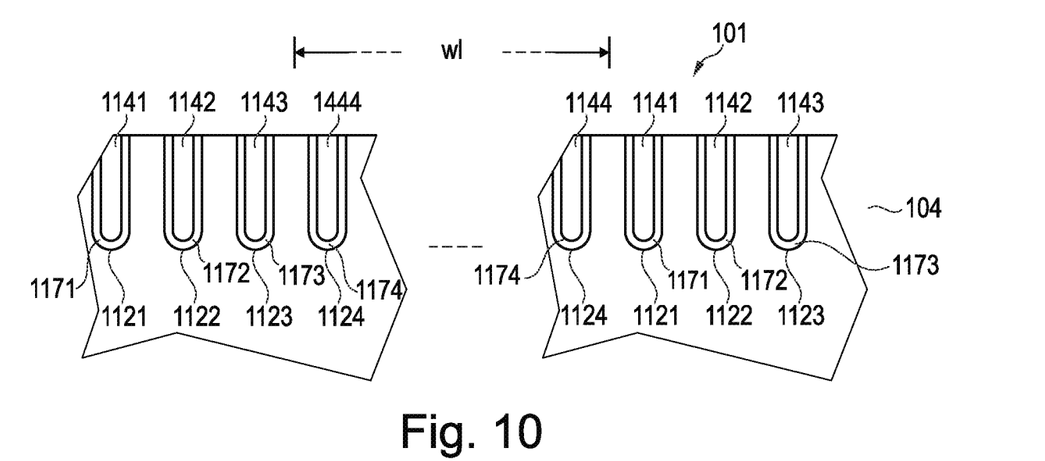

The schematic cross-sectional view of FIG. 10 illustrates fourth trenches 1124 that may be arranged between different groups of first to third trenches 1121, 1122, 1123, for example. The view of FIG. 10 merely illustrates the arrangement of the trenches without providing details with respect to semiconductor regions or contact schemes. Each of the fourth trenches 1124 includes an electrode in the fourth trench 1144 and a dielectric 1174. By altering a number of the fourth trenches 1124 between different groups of first to third trenches 1121, 1122, 1123, a lateral extension wl of the sequence of fourth trenches 1124 may be varied. For example, the lateral extension wl may be smaller than 20%, or smaller than 15%, or smaller than 10% of a thickness, i.e. vertical extension, of the semiconductor body 104. This may allow for adjusting charge carrier accumulation, e.g. a charge carrier plasma in an on-state, capacitances, e.g. input and output capacitances, and a gate charge, for example. The electrodes in the fourth trenches 1144 may be electrically coupled to a first load contact L1, or to the first or second gate driver output G1, G2. When electrically coupling the electrodes in the fourth trenches 1144 to the first or second gate driver output G1, G2, mesa regions adjoining to the corresponding fourth trenches 1144 may not be electrically contacted, e.g. be electrically floating and/or may not include any source regions. This may allow for avoiding injection of electrons toward the collector in an on-state of the device.

Figure 11:
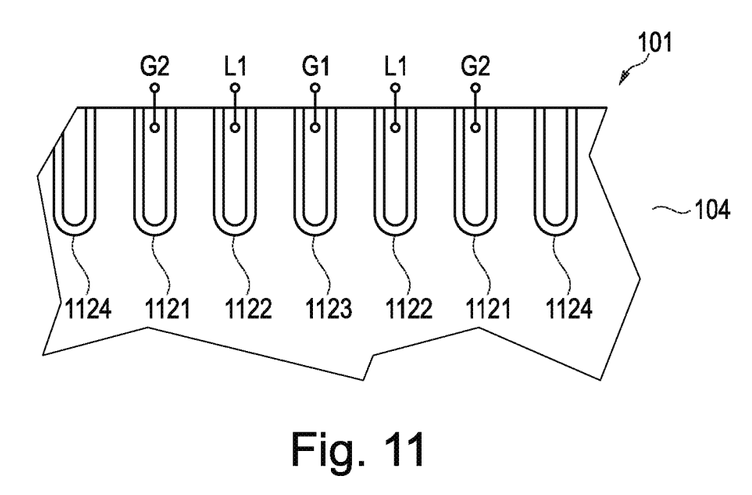

The schematic cross-sectional view of FIG. 11 illustrates an exemplary IGBT 101 including a third trench 1123 having an electrode 1143 electrically coupled to the first gate driver output G1. The third trench 1123 is arranged between second trenches 1122, wherein an electrode 1142 in each of the second trenches 1122 is electrically coupled to a first load contact terminal L1, e.g. a source or emitter terminal. The second trenches 1122 and the third trench 1123 are arranged between the first trenches 1121, wherein an electrode 1141 in each of the first trenches 1121 is electrically coupled to the second gate driver output G2. This may allow for further improving the desaturation mechanism.

Figure 12A:
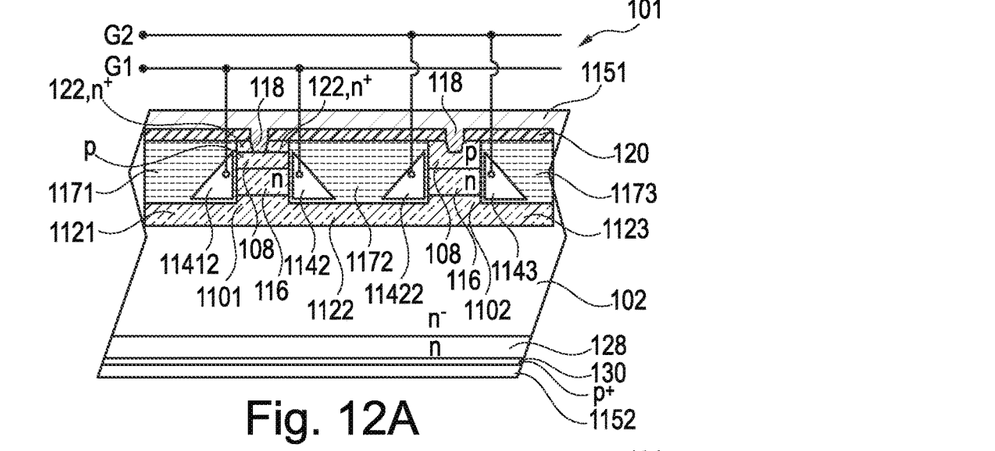
FIGS. 12A to 12C are schematic cross-sectional views for illustrating exemplary dual side gate designs of IGBTs.
Figure 12B:
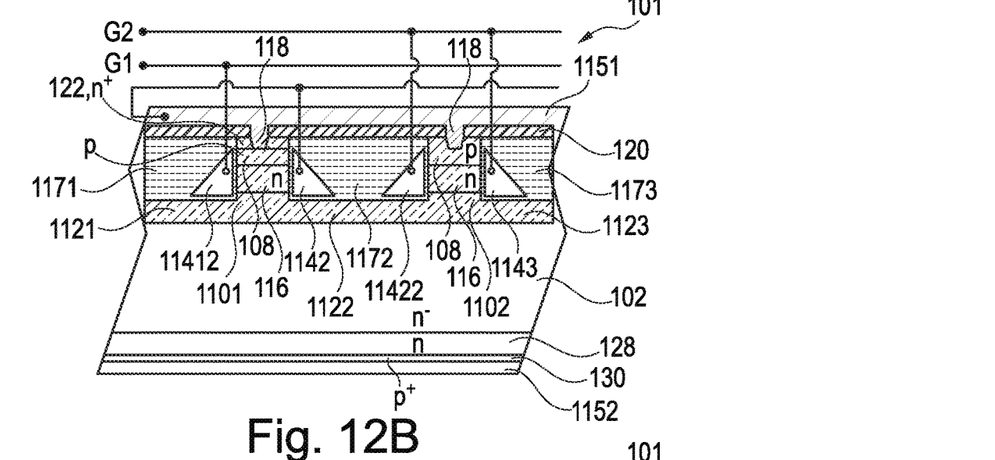
Figure 12C:
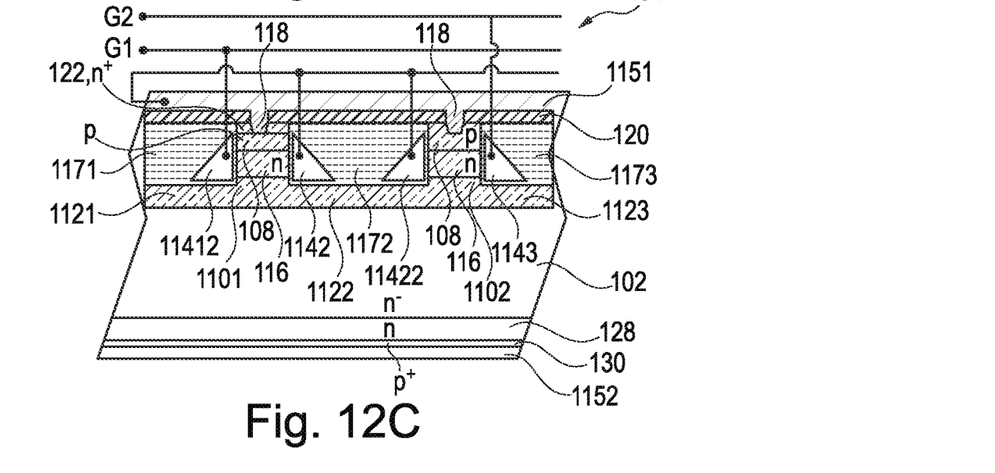

The exemplary IGBTs 101 illustrated in the schematic cross-sectional views of FIGS. 12A to 12C each include a second electrode in the first to third trenches. The second electrode in the first to third trenches is also electrically coupled to one of the first gate driver output G1, the second gate driver output G2 and the first load contact 1151. The schematic views of FIGS. 12A to 12C illustrate a second electrode in the first trench 11412 and a second electrode in the second trench 11422.

A variety of combinations and electrode permutations may be achieved by electrically connecting the two electrodes in the first to third trenches 1141, 1142, 1143 to same or different electrodes of the electrode group. In each of the first to third trenches 1141, 1142, 1143, the electrode and the second electrode face one another along a lateral direction and a dielectric is arranged between the electrode and the second electrode (see e.g. the dielectric 1172 between the electrode in the second trench 1142 and the second electrode in the second trench 11422).

Figure 13:
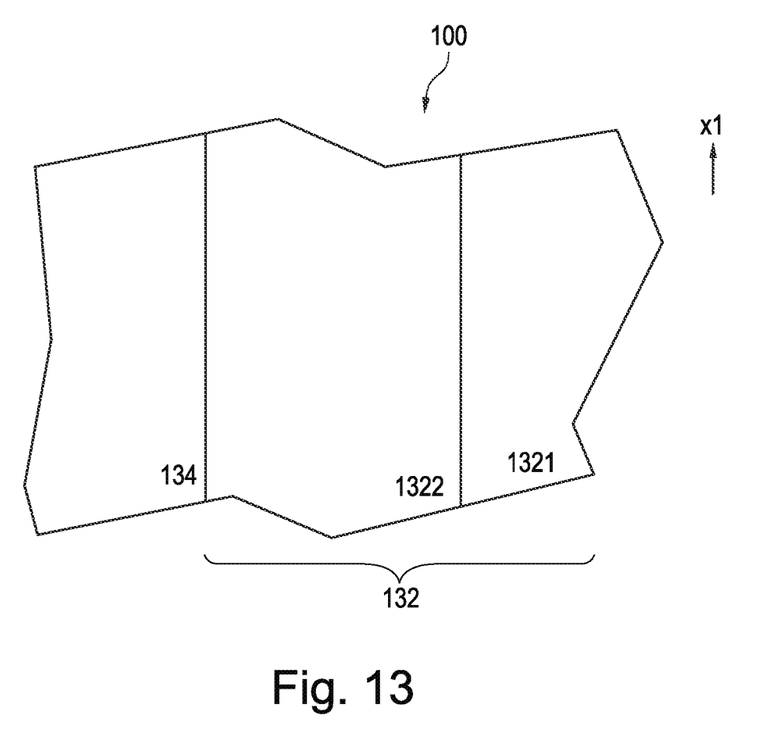
FIGS. 13, 14A and 14B are schematic plan views for illustrating a transistor cell area of a semiconductor device.

The schematic plan view of FIG. 13 illustrates an exemplary semiconductor device 100 including a transistor cell area 132 and an edge termination area 134 at least partly surrounding the transistor cell area 132 at the first main surface. A percentage of trenches including the second gate electrode is smaller in a first part 1321 of the transistor cell area 132 than in a second part 1322 of the transistor cell area 132, wherein the second part 1322 is arranged between the first part 1321 and the edge termination area 134. The trenches in the transistor cell area 132 may extend in parallel along a first lateral direction xl.

Figure 14A:
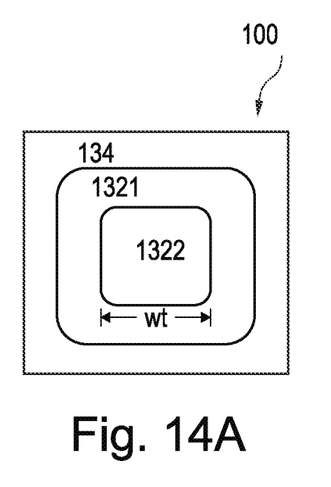
Figure 14B:
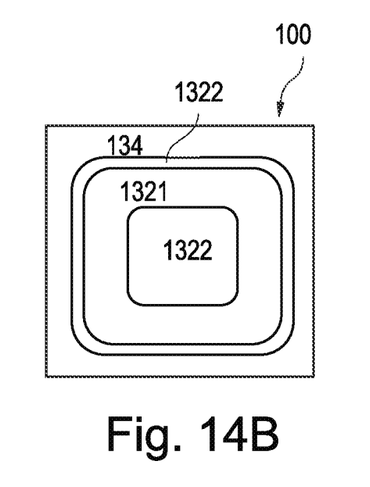

The schematic plan view of FIG. 14A illustrates an exemplary semiconductor device 100 having a width of a channel configured to be controlled by the second gate electrode G2 in the second part 1322 that is larger than in the first part 1321. This may allow for increasing a load current density in the second part 1322 compared with the first part 1321, for example. The examples illustrated in FIGS. 13 and 14A may allow for homogenizing energy dissipation across an active area, e.g. a transistor cell area, of the device, for example. Moreover, a width of a channel configured to be controlled by the first gate electrode G1 in the second part 1322 may also be larger than in the first part 1321. This may allow for lowering the current density in the second part 1322 during switching, and may allow for improving robustness during switching. For example, a lateral extension wt of the second part 1322 be larger than 10% of a thickness of the semiconductor body, or larger than 20% of a thickness of the semiconductor body, or even larger than 30% of a thickness of the semiconductor body. The second part 1322 may cover between 20% and 70%, or between 30% and 60%, or between 40% and 60% of the active area of the device 100, for example. Referring to the schematic top view of FIG. 14B, the second part 1322 may also be divided into several sub-parts 13221, 13222, wherein the sub-parts 13221, 13222 may differ from one another with respect to one or more characteristic, for example.

The aspects and features mentioned and described together with one or more of the previously described examples and figures, may as well be combined with one or more of the other examples in order to replace a like feature of the other example or in order to additionally introduce the feature to the other example.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a drift region of a first conductivity type in a semiconductor body having a first main surface;
a body region of a second conductivity type between the drift region and the first main surface; and
a plurality of trenches extending into the semiconductor body from the first main surface and patterning the semiconductor body into a plurality of mesas,
wherein the plurality of trenches includes:
a first trench having an electrode electrically coupled to a first gate driver output;
a second trench having an electrode electrically coupled to the first gate driver output;
a third trench having an electrode electrically coupled to a second gate driver output;
a fourth trench having an electrode electrically coupled to a first load contact terminal; and
a fifth trench having an electrode electrically coupled to the first load contact terminal,
wherein the third trench, the fourth trench, and the fifth trench are arranged between the first trench and the second trench,
wherein a width of a channel configured to be controlled by the gate electrode in the first trench differs from a width of a channel configured to be controlled by the both electrode in the second trench and the electrode in the third trench.

2. The semiconductor device of claim 1, wherein the fourth trench is arranged between the second trench and the first trench, and wherein the fifth trench is arranged between the third trench and the first trench.

3. The semiconductor device of claim 1, wherein a mesa that adjoins the first trench includes a source region that adjoins the first trench, wherein a mesa that adjoins the second trench is devoid of a source region that adjoins the second trench, and wherein a mesa that adjoins the third trench is devoid of a source region that adjoins the third trench.

4. The semiconductor device of claim 1, wherein a mesa that adjoins the first trench includes a source region that adjoins the first trench, wherein a mesa that adjoins the fourth trench is devoid of a source region that adjoins the fourth trench, and wherein a mesa that adjoins the fifth trench is devoid of a source region that adjoins the fifth trench.

5. The semiconductor device of claim 1, further comprising:
a barrier region of the first conductivity type having a higher doping concentration than the drift region and being arranged between the drift region and the body region in each of the mesas.

6. The semiconductor device of claim 5, wherein a maximum doping concentration in the barrier region is at least a factor of 100 higher than a maximum doping concentration in a part of the drift region adjoining to the barrier region, and wherein a vertical extension of the part of the drift region is equal to a vertical extension of the barrier region.

7. The semiconductor device of claim 5, wherein a dose of first conductivity type dopants of the barrier region is larger than $2 \times 10^{13}$ cm$^{-2}$.

8. The semiconductor device of claim 5, wherein a vertical distance between a maximum doping concentration peak in the barrier region and the first main surface ranges from 30% to 70% of a second vertical distance from a bottom of the second trench to the first main surface.

9. A semiconductor device, comprising:
a drift region of a first conductivity type in a semiconductor body having a first main surface;
a body region of a second conductivity type between the drift region and the first main surface; and
a plurality of trenches extending into the semiconductor body from the first main surface and patterning the semiconductor body into a plurality of mesas,
wherein the plurality of trenches includes:
a first trench having first and second electrodes that face one another along a lateral direction, and a dielectric filling a remainder of the first trench not occupied by the first and second electrodes;
a second trench having first and second electrodes that face one another along a lateral direction, and a dielectric filling a remainder of the second trench not occupied by the first and second electrodes; and
a third trench having first and second electrodes that face one another along a lateral direction, and a dielectric filling a remainder of the third trench not occupied by the first and second electrodes.

10. The semiconductor device of claim 9, wherein the second electrode in the first trench and the first electrode in the second trench face opposite sides of the mesa delimited by the first and second trenches, and wherein the second electrode in the second trench and the first electrode in the third trench face opposite sides of the mesa delimited by the second and third trenches.

11. The semiconductor device of claim 10, wherein the second electrode in the first trench is electrically coupled to a first gate driver output, wherein the first electrode in the second trench is electrically coupled to the first gate driver output, wherein the second electrode in the second trench is electrically coupled to a second gate driver output, and wherein the first electrode in the third trench is electrically coupled to the second gate driver output.

12. The semiconductor device of claim 10, wherein the second electrode in the first trench is electrically coupled to a first gate driver output, wherein the first electrode in the second trench is electrically coupled to a first load contact terminal, wherein the second electrode in the second trench is electrically coupled to a second gate driver output, and wherein the first electrode in the third trench is electrically coupled to the second gate driver output.

13. The semiconductor device of claim 10, wherein the second electrode in the first trench is electrically coupled to a first gate driver output, wherein the first electrode in the second trench is electrically coupled to a first load contact terminal, wherein the second electrode in the second trench is electrically coupled to the first load contact terminal, and wherein the first electrode in the third trench is electrically coupled to a second gate driver output.

14. The semiconductor device of claim 9, further comprising:
a barrier region of the first conductivity type having a higher doping concentration than the drift region and being arranged between the drift region and the body region in each of the mesas.

15. The semiconductor device of claim 14, wherein a maximum doping concentration in the barrier region is at least a factor of 100 higher than a maximum doping concentration in a part of the drift region adjoining to the barrier region, and wherein a vertical extension of the part of the drift region is equal to a vertical extension of the barrier region.

16. The semiconductor device of claim 14, wherein a dose of first conductivity type dopants of the barrier region is larger than $2 \times 10^{13}$ cm$^{-2}$.

17. The semiconductor device of claim 14, wherein a vertical distance between a maximum doping concentration peak in the barrier region and the first main surface ranges from 30% to 70% of a second vertical distance from a bottom of the second trench to the first main surface.

18. A semiconductor device, comprising:
a drift region of a first conductivity type in a semiconductor body having a first main surface;
a body region of a second conductivity type between the drift region and the first main surface; and
a plurality of trenches extending into the semiconductor body from the first main surface, the plurality of trenches patterning the semiconductor body into a plurality of mesas comprising a first mesa between a first trench and a second trench, and a second mesa between the second trench and a third trench, wherein an electrode in the first trench is one electrode out of an electrode group of a first gate electrode electrically coupled to a first gate driver output, a second gate electrode electrically coupled to a second gate driver output, and a source electrode electrically connected to a first load contact, wherein an electrode in the second trench is another electrode out the electrode group, and an electrode in the third trench is a remaining electrode out of the electrode group; and
a barrier region of the first conductivity type having a higher doping concentration than the drift region and being arranged between the drift region and the body region in each of the first mesa and the second mesa,
wherein a vertical distance between a maximum doping concentration peak in the barrier region and the first main surface ranges from 30% to 70% of a second vertical distance from a bottom of the second trench to the first main surface.

19. The semiconductor device of claim 18, wherein a maximum doping concentration in the barrier region is at least a factor of 100 higher than a maximum doping concentration in a part of the drift region adjoining to the barrier region, and wherein a vertical extension of the part of the drift region is equal to a vertical extension of the barrier region.

20. The semiconductor device of claim 18, wherein a dose of first conductivity type dopants of the barrier region is larger than $2\times10^{13}$ cm$^{-2}$.

* * * * *

UNITED STATES PATENT AND TRADEMARK OFFICE
CERTIFICATE OF CORRECTION

PATENT NO. : 12,255,251 B2
APPLICATION NO. : 18/212906
DATED : March 18, 2025
INVENTOR(S) : R. Baburske Page 1 of 1

It is certified that error appears in the above-identified patent and that said Letters Patent is hereby corrected as shown below:

In the Claims

Column 12, Lines 58-59 (Claim 1, Lines 25-26), please change "by the both" to -- by both the --.

Signed and Sealed this
Thirteenth Day of May, 2025

Coke Morgan Stewart
*Acting Director of the United States Patent and Trademark Office*